United States Patent
Bujanos

[11] Patent Number: 5,994,969
[45] Date of Patent: Nov. 30, 1999

[54] RING OSCILLATOR HAVING AUTOMATIC GAIN AND LOW FREQUENCY SHUT OFF CIRCUITS

[75] Inventor: Norman Bujanos, Austin, Tex.

[73] Assignee: Advanced Micro Devices, Inc., Austin, Tex.

[21] Appl. No.: 08/995,332

[22] Filed: Dec. 22, 1997

[51] Int. Cl.[6] .................................. H03B 5/02; H03L 5/00
[52] U.S. Cl. ........................ 331/57; 331/109; 331/177 R; 331/183
[58] Field of Search ..................... 331/57, 109, 177 R, 331/183

[56] References Cited

U.S. PATENT DOCUMENTS

| | | | |
|---|---|---|---|
| 4,810,975 | 3/1989 | Dias | 331/57 |
| 5,272,453 | 12/1993 | Traynor et al. | 331/57 |
| 5,485,114 | 1/1996 | Funakura et al. | 327/262 |
| 5,485,126 | 1/1996 | Gersbach et al. | 331/57 |
| 5,568,103 | 10/1996 | Nakashima et al. | 331/185 |
| 5,592,126 | 1/1997 | Boudewijns et al. | 331/45 |

OTHER PUBLICATIONS

A PLL Clock Generator with 5 to 110 MHz of Lock Range Microprocessors, IEEE Journal of Solid–State Circuits, vol. 27, No. 11, Nov. 1992, pp. 1599 through 1607.

*Primary Examiner*—Siegfried H. Grimm
*Attorney, Agent, or Firm*—Akin, Gump, Strauss, Hauer & Feld, LLP

[57] ABSTRACT

A ring oscillator with differential delay stages employs an automatic gain control circuit producing a gain adjust signal that is responsive to a frequency control voltage applied to the ring oscillator. The effect of the frequency control voltage on the output voltage of the ring oscillator is counterbalanced by the gain adjust signal which prevents the output voltages of the delay stages from varying excessively over frequency. Further, the output stage of the ring oscillator includes shut off circuitry that allows the ring oscillator to be shut off in a non-oscillating mode in which it draws little current.

12 Claims, 5 Drawing Sheets

RING OSCILLATOR HAVING AUTOMATIC GAIN AND LOW FREQUENCY SHUT OFF CIRCUITS

BACKGROUND OF THE INVENTION

1. Field of the Invention

The invention pertains to oscillator circuits, and more specifically to a multi-stage differential ring oscillator with automatic gain controller and low frequency shut off.

2. Description of Related Art

Oscillators are used in a variety of integrated circuits to generate clocking signals. One type of well known oscillator design is a multi-stage differential ring oscillator. Such an oscillator is generally constructed of a plurality of delay cells, delay cell gain adjust circuitry, and an output stage.

There are a number of concerns for power sensitive designs for ring oscillators. These concerns include dynamic power consumption, static power consumption, and a range of operability. Affecting dynamic power consumption and range of operability is the gain control circuitry. Generally, delay cells have outputs whose amplitudes vary with operating frequency. Gain adjust circuitry is provided to the delay cells to counteract that variance. Over the operating range of the oscillator, the gain adjust circuitry ensures the output levels will not vary by an excessive amount. This permits both the wide range of operation and prevents high dynamic power consumption in a situation where the delay cells might drive their outputs to excessive levels.

Prior ring oscillator designs often employed fairly complex automatic gain control circuitry that tracked the output levels of either an actual delay cell or a "dummy" delay cell to provide gain control to keep the output level constant. This feedback approach, however, typically required an extra differential amplifier and other additional circuitry.

Static power consumption can be affected when the oscillator is turned off. Some designs permit excessive current drain due to low frequency oscillations, even when the oscillator is off.

SUMMARY OF THE INVENTION

A ring oscillator according to the invention employs both simplified gain adjust circuitry and a low power "shut off" circuit. Instead of employing a feedback approach for gain adjust circuitry, the gain adjust circuitry provides a gain adjust signal strictly in response to the input voltage that controls the operating frequency of the entire oscillator. In one embodiment, as the frequency control voltage increases, a gain adjust signal is pulled further and further toward a ground level. This gain adjust signal is in turn provided to a transistor in the delay cells, which provides a higher positive voltage to the delay cells, proportionately increasing the output levels. Because the pull down of the gain adjust circuitry is proportional to the pull up of the delay cells, the output voltages of the delay cells do not excessively vary over frequency.

Further according to the invention, an output stage employs shut off circuitry. In historical circuits, ring oscillators were typically "shut off" by pulling the DC input control signal to either a plus or minus supply rail. Although this tended to shut off the voltage control oscillator to some extent, low frequency oscillations could still result, which at times led to high current draws in the output stage. According to the invention, however, the VCO is shut off not simply by pulling the input voltage to a supply rail, but instead by clamping the output stage so that no low frequency oscillations can occur.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
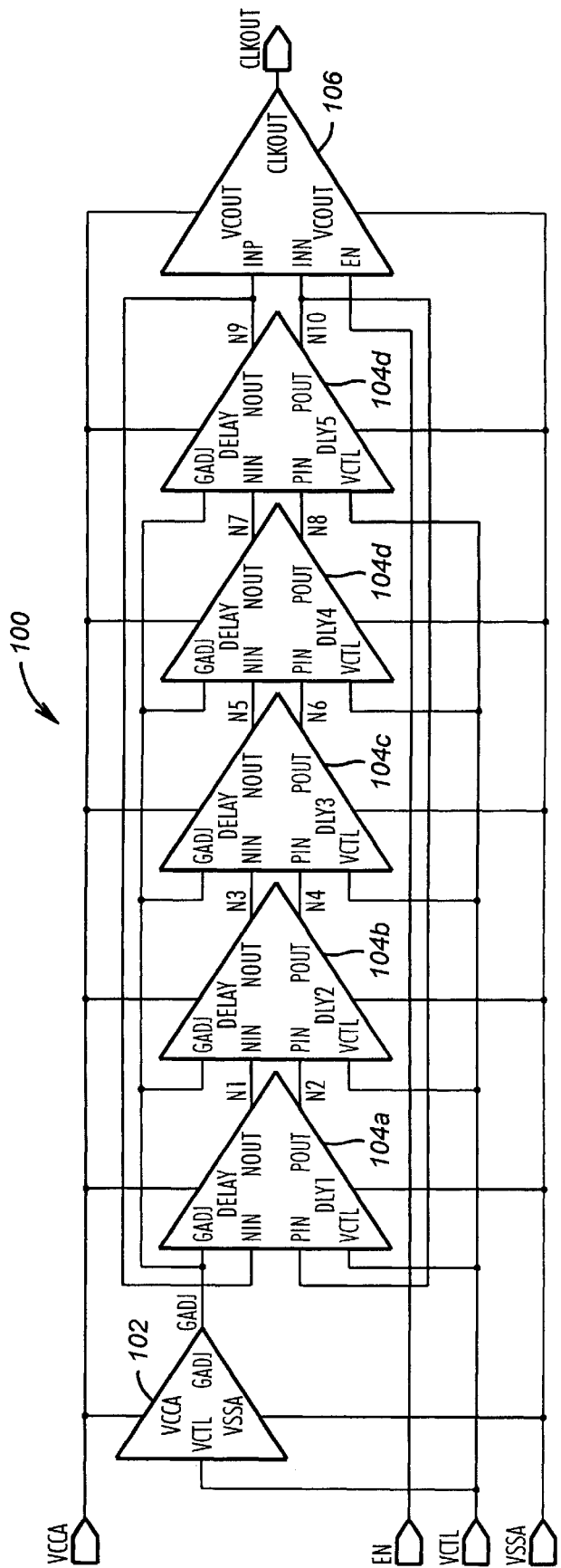
FIG. 1 is a block diagram illustrating the delay stages, the output stage, and the gain adjust stage of a ring oscillator according to the invention.

FIG. 1 is a block diagram illustrating a gain control stage 102, a plurality of delay stages 104a–104e, and an output stage 106. A positive supply $V_{CC}$ and a negative (or ground) supply $V_{SS}$ is provided to each of the stages 102–106, and an enable signal is provided to the output stage 106. Further, a frequency control voltage $V_{CTL}$ is provided to the gain control stage 102 and the delay stages 104A through 104E.

As can be seen by reference to FIG. 1, the output of each of the delay stages 104 is provided to the input of the next delay stage, with the output of the last delay stage 104e being provided to the input of the first delay stage 104a—thus the "ring" nature of the ring oscillator. While additional stages can be provided for multiple phase clocks and further stability, the illustrated ring oscillator 100 includes five delay stages 104a–104e. Further, a gain adjust signal $G_{ADJ}$ is provided from the gain adjust stage 102 to each of the delay stages 104a–104e.

According to the invention, the gain adjust signal $G_{ADJ}$ is provided to compensate for the frequency of operation of each of the delay stages 104. Typically, without the gain adjust signal $G_{ADJ}$, the delay stages output amplitude diminishes with frequency. According to the invention, however, the gain adjust stage 102 provides the gain adjust signal $G_{ADJ}$ to compensate for that variance in frequency, but does so only using the frequency control voltage $V_{CTL}$ as an input. This is discussed in conjunction with FIGS. 2–6 below. That is, in contrast to prior ring oscillators, there is no feedback from the output of a dummy or real delay stage leg, and that corresponding feedback circuitry is eliminated.

Further according to the invention, the output stage 106 includes clamping circuitry that, when the ring oscillator is disabled by the enable signal EN being deasserted, forces the clock output CLKOUT to a fixed, non-oscillating value and reduces any internal current drains of the output circuitry 106. This is further discussed in conjunction with FIG. 7 below.

Figure 2:
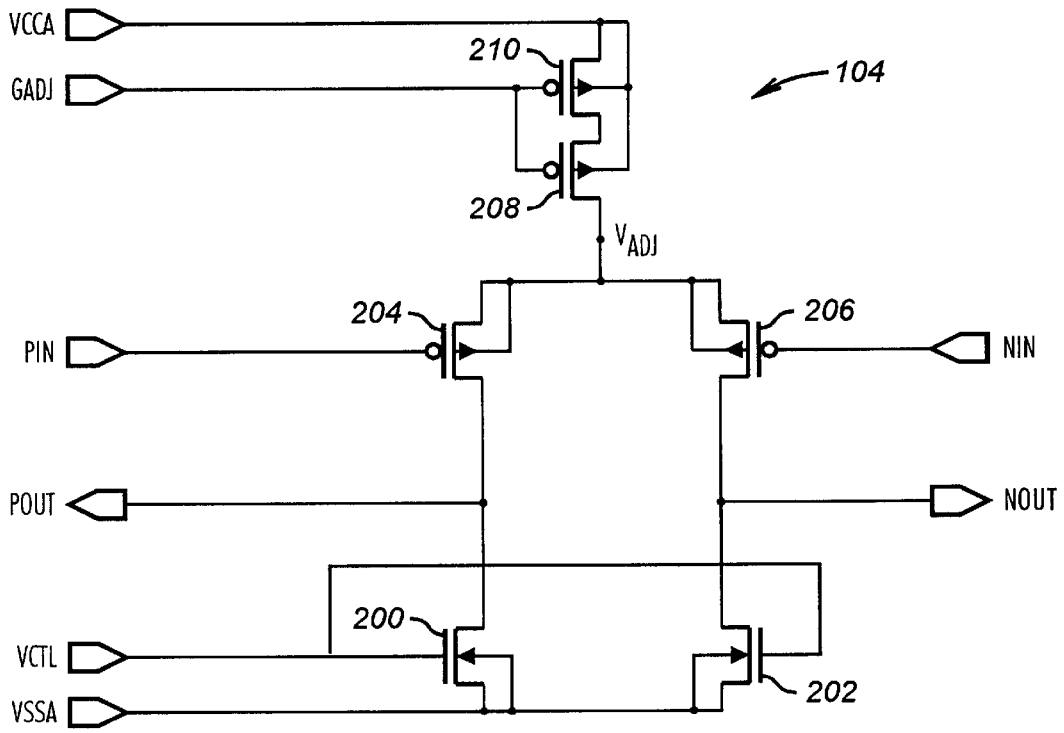
FIG. 2 is a schematic illustration of a differential amplifier delay cell with a gain adjust input according to the invention.

Turning to FIG. 2, illustrated is a delay stage 104 of the ring oscillator 100. The differential delay cell of the delay stage 104 is a differential PMOS cascode amplifier. The control signal $V_{CTL}$ drives the gates of two n-channel MOS transistors 200 and 202, whose sources are tied to $V_{SS}$ and whose drains are respectively tied to two p-channel transistors 204 and 206. The sources of the p-channel transistors 204 and 206 are provided with an adjusted voltage $V_{ADJ}$, which is in turn provided by the drain of a p-channel transistor 208, which is connected in series with a p-channel transistor 210. The transistors 208 and 210 couple the high rail voltage $V_{CC}$ and provide the adjusted voltage $V_{ADJ}$ at a level that is adjusted by the gain adjust signal $G_{ADJ}$, which gates the two transistors 208 and 210. Positive and negative inputs $P_{IN}$ and $N_{IN}$ are respectively provided to the gates of the transistors 204 and 206, and positive and negative outputs $P_{OUT}$ and $N_{OUT}$ are provided at the drains of the transistors 204 and 206.

In operation, the differential delay cell 104 is initially provided with $V_{CTL}$ below the operating thresholds for the transistors 200 and 202, so the voltage controlled oscillator (VCO) is functionally off. As the voltage on $V_{CTL}$ increases, the transistors 200 and 202 begin conducting according to the following equation:

$$I_d = K'W/L[(V_{gs}-V_t)-V_{ds}/2]V_{ds}(1+\text{lamda}) \quad (1)$$

where $I_d$=current through the transconductance parameter, W=gate width L=gate length, $V_{ds}$=the drain to source voltage and $V_t$=threshold voltage, and lamda=a channel length modulation parameter.

The time delay across the delay cell then becomes proportional to the equation:

$$T_d = V_p C / I_d \quad (2)$$

where $T_d$ the delay across the cell, $V_p$=the voltage of $P_{OUT}$ to $V_{SS}$, C is the gate capacitance of the 204 or 206 transistor, and $I_d$=the current flowing through the capacitive load. In the configuration of FIG. 1, five delay stages 104 are used, so the operating frequency is expressed as:

$$\text{Frequency}=1/T_d=I_d/(5V_p C) \quad (3)$$

It will be appreciated that if the two gain control transistors 208 and 210 were omitted, the amplitude of the output signals $P_{OUT}$ and $N_{OUT}$ would decrease as $V_{CTL}$ increased. This is because more current would flow through the transistors 200 and 202, leading to a smaller voltage drop relative to the drop across the transistors 204 and 206. Therefore, the two transistors 208 and 210 are provided with the $G_{ADJ}$ signal so that as the operating frequency increases, the $G_{ADJ}$ signal is dropped by the gain adjust stage 102, thus providing a higher voltage $V_{ADJ}$ at the sources of the transistors 204 and 206.

Figure 3:
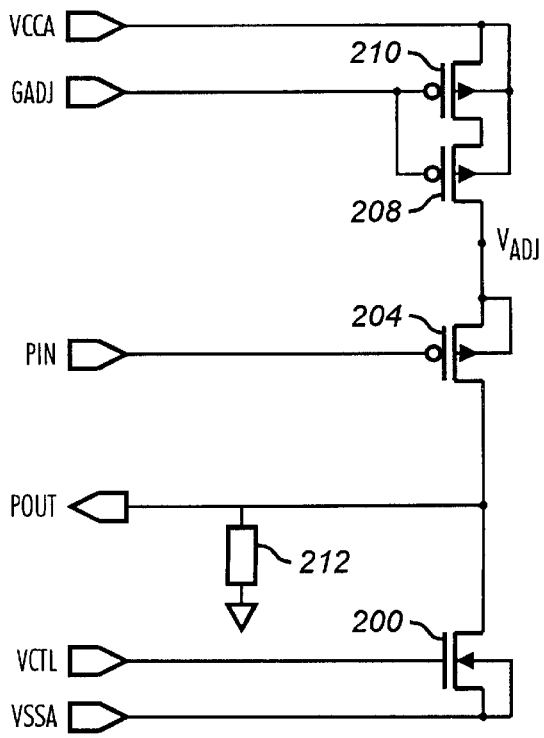
FIG. 3 is a schematic illustration of one leg of the delay cell of FIG. 2.
Figure 4:
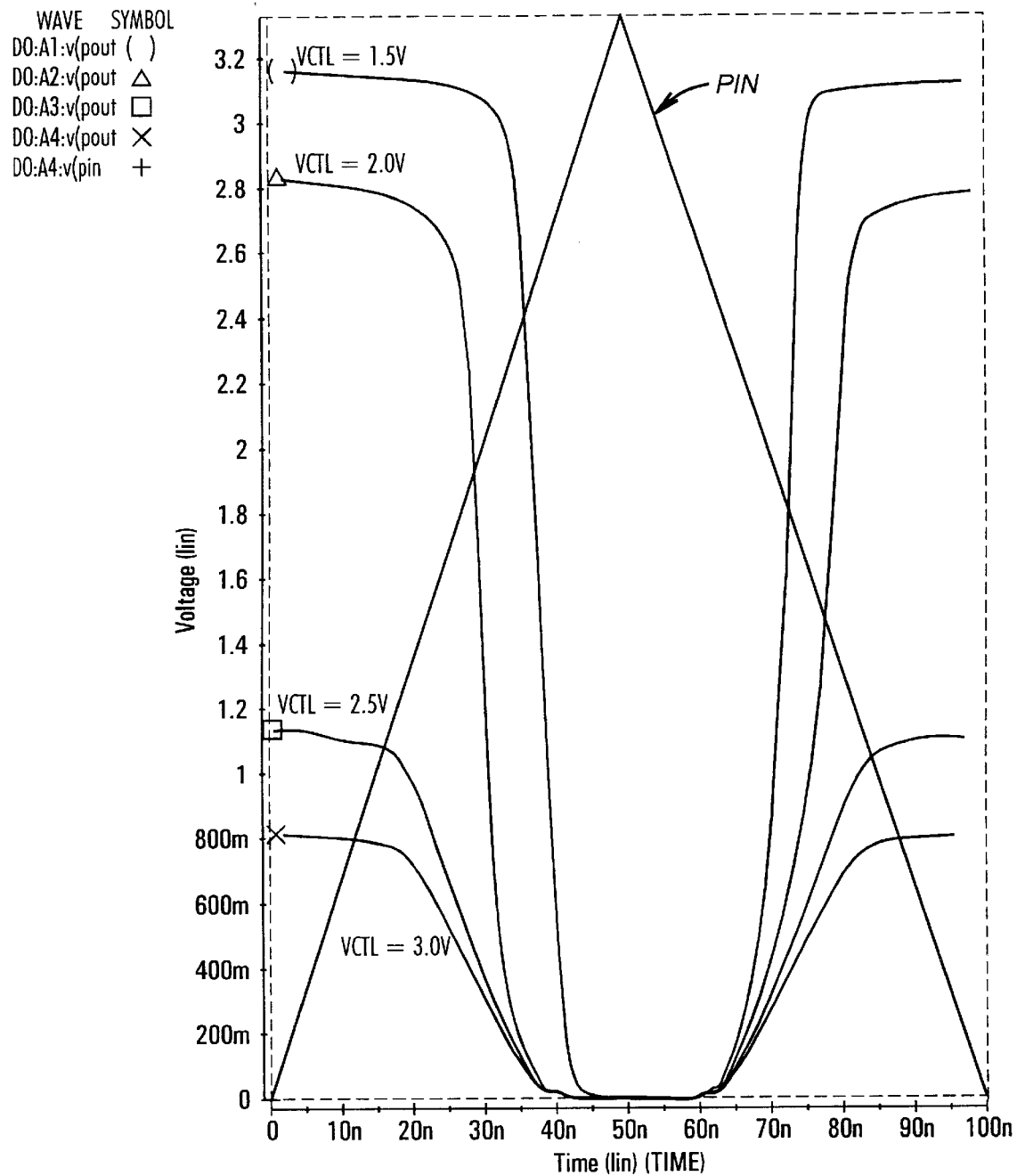
FIG. 4 is a voltage versus time diagram illustrating operation of the delay cell of FIG. 2 without the use of the gain adjust stage of FIG. 1.

This operation becomes more apparent in reference to FIG. 3, which shows one leg of the differential amplifier 104 of FIG. 2. Referring to FIG. 3, an impedance 212 reflects the impedance provided by the load of the next delay cell 104 following the illustrated delay cell 104. This is typically around forty femtofarads. As $V_{CTL}$ increases, the gate to source voltage $V_{gs}$ of the transistor 200 increases, which in turn increases the current $I_d$. Referring to equation (3) above, this causes the operating frequency to in turn increase. But from a static standpoint, as $V_{CTL}$ increases, the transistor 200 pulls $P_{OUT}$ "harder", and does not allow the transistor 204 to pull $P_{OUT}$ as high or to the rail. FIG. 4 is a timing diagram illustrating this effect for various values of $V_{CTL}$, but when the gain adjust signal $G_{ADJ}$ is not used. As can be seen, the output voltage amplitude varies significantly with respect to $V_{CTL}$, and thus with respect to frequency.

By controlling the gates of the transistors 208 and 210, however, the gain adjust signal $G_{ADJ}$ increases the pull up strength of $V_{CC}$ on $V_{ADJ}$ as $G_{ADJ}$ decreases. This is the inverse effect that $V_{CTL}$ has on the drive strength of the transistor 200. Thus, the effects of $V_{CTL}$ and $G_{ADJ}$ counterbalance each other.

Figure 5:
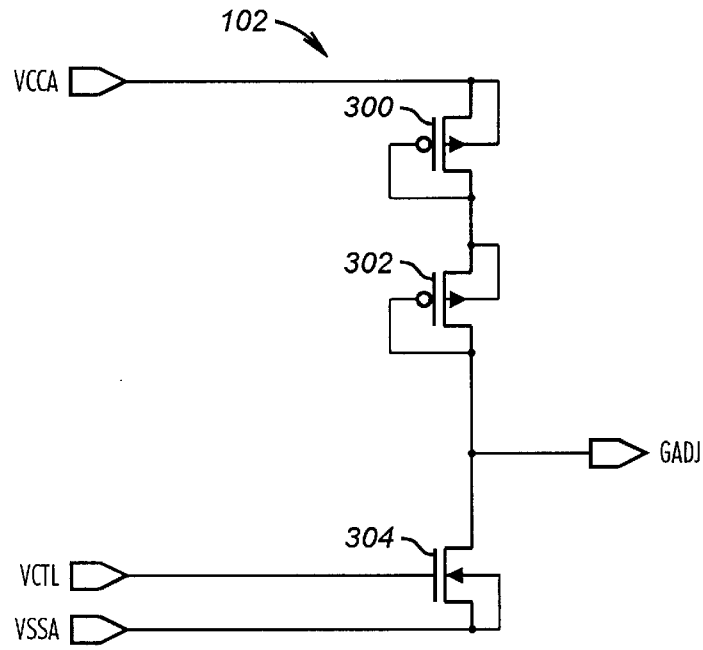
FIG. 5 is a schematic illustration of the gain adjust circuitry of FIG. 1.
Figure 6:
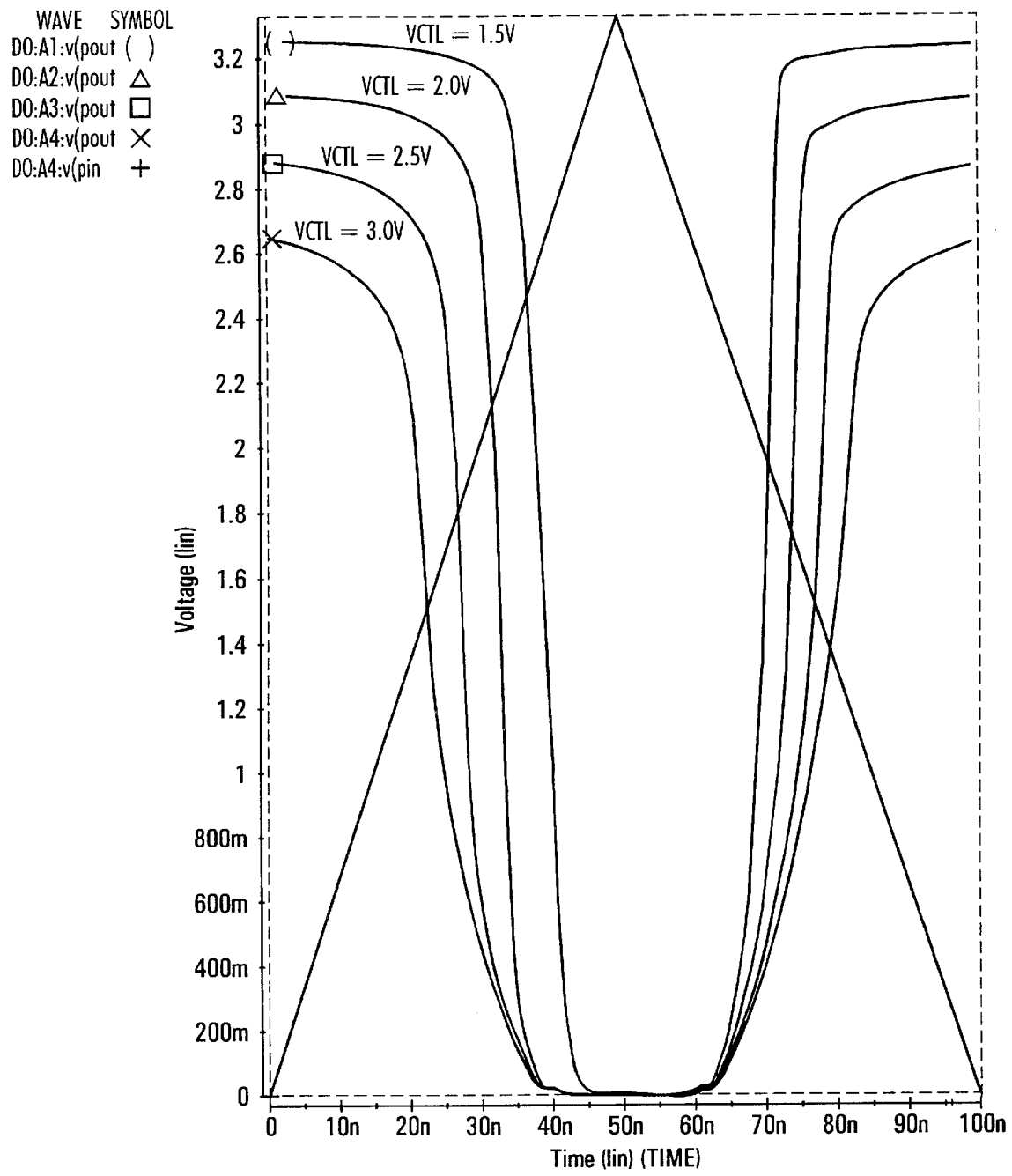
FIG. 6 is a voltage versus time diagram illustrating the output of the delay cell of FIG. 2 when the gain adjust stage of FIG. 1 is employed.

Turning to FIG. 5, shown is the circuitry used for the gain adjust stage 102. Shown is an inverting amplifier with $V_{CC}$ being provided through two pull up transistors 300 and 302, with the drain of the p-channel transistor 302 providing as the gain adjust signal $G_{ADJ}$. The gain adjust signal, however, is pulled down towards $V_{SS}$ by an n-channel transistor 304. The gate of the n-channel transistor 304 is in turn controlled by the frequency control voltage $V_{CTL}$. It will be appreciated that as the frequency control voltage $V_{CTL}$ increases, the gain adjust signal $G_{ADJ}$ falls, being pulled down towards $V_{SS}$. The timing diagram of FIG. 6 illustrates the effect on the output voltage $P_{OUT}$ when the gain adjust circuit 102 is used to provide the gain adjust signal $G_{ADJ}$ to the transistors 208 and 210 of FIG. 3. As can be seen, as the control voltage ranges from 1.6 to 3 volts, the output signal $P_{OUT}$ of the delay stage 104 is far less affected than the output signals illustrated in FIG. 4, where the gain adjust signal $G_{ADJ}$ is not used. Thus, using the simple circuit of FIG. 5, which does not employ feedback but is instead based strictly on the level of $V_{CTL}$, the output amplitudes of the delay stages 104 are prevented from excessively changing.

Therefore, by using this simple circuit for the gain adjust stage 102, the delay stages 104 do not excessively vary in their output signal strength, and thus can operate over a variety of frequencies without excessive current flow and without providing too weak of a signal to the next stage.

Figure 7:
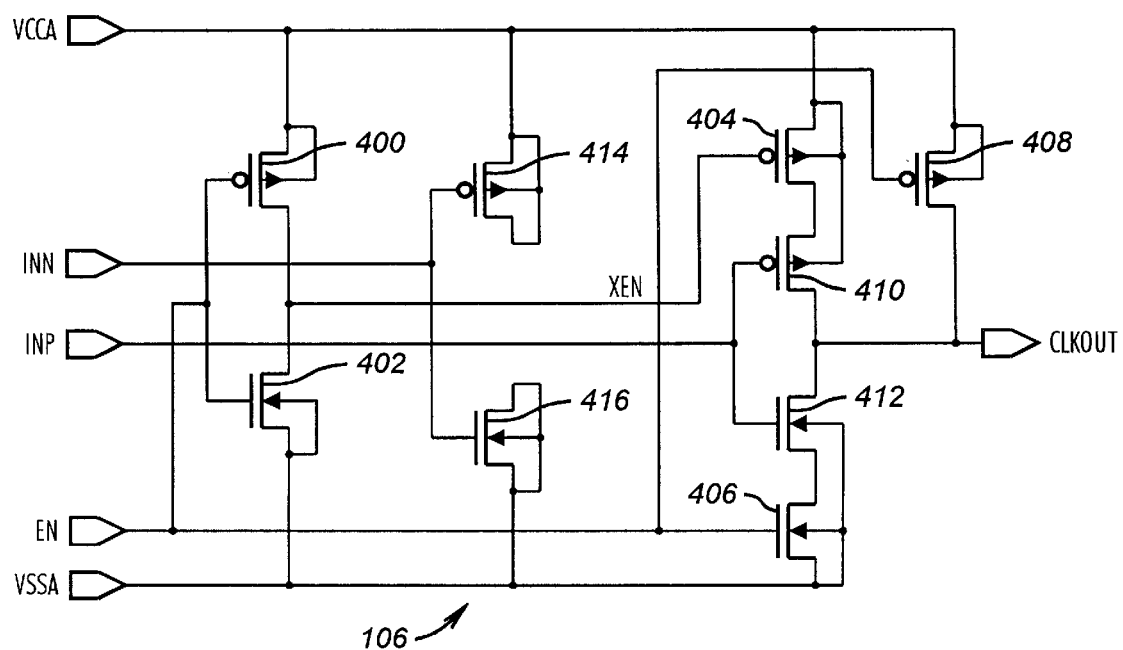
FIG. 7 is a schematic illustration of an output stage of the differential ring oscillator of FIG. 1.

From the output of the delay stages 104, the output stage 106 receives input signals $IN_N$ and $IN_P$ from the outputs $N_{OUT}$ and $P_{OUT}$ of the delay stage 104e. This output stage 106 is illustrated in FIG. 7. An enable signal EN, when true, allows a clock signal CLKOUT to provide a driven output based on the input signal from the delay stage 104e. When the enable signal is true, a transistor 400 is off and a transistor 402 is on. These are coupled in series between $V_{CC}$ and $V_{SS}$, and form an inverter. The drains of the two transistors 400 and 402 are joined to provide an inverted enable signal XEN, which is provided to the gate of a transistor 404. The enable signal EN is further provided to the gate of a transistor 406. When the enable signal EN is true, both of these transistors 404 and 406 are turned on, and the circuit operates effectively as though these transistors 404 and 406 are shorts. Further, an output pull up transistor 408, also gated by the enable signal EN, is turned off when the enable signal is true. Thus, when the enable signal is true, the two transistors 410 and 412, acting as a push-pull inverter output stage, drive the clock signal CLKOUT responsive to $IN_P$. Of note, two other transistors 414 and 416, driven by the input signal $IN_N$, are provided for input load balancing.

When the enable signal EN is deasserted, however, the output signal CLKOUT is pulled high to $V_{CC}$ and the circuit does not provide an oscillating output, either at low or high frequencies. Specifically, the push-pull output stage formed by the transistors 410 and 412 is isolated from the $V_{CC}$ and $V_{SS}$ supplies, and therefore does not draw any appreciable current. Further, the pull up transistor 408 is turned on by the enable signal EN, pulling the output to the positive rail $V_{CC}$. Thus, by isolating the output stage 106, current draw is reduced when the oscillator is disabled; by pulling up the output signal, the output is not allowed to oscillate. In this way, the output stage operates in a low current mode and does not provide an oscillating output signal.

It will be appreciated that a wide variety of other circuitry and specific components could be provided according to the concepts of the disclosed embodiment. Specifically, other types of transistors can be used, other types of output stages can be used, and other types of delay stages can be used. All of these will be appreciated to those of ordinary skill in the art.

What is claimed is:

1. A ring oscillator with gain control and a frequency control input signal, comprising:
   a plurality of delay stages connected in a ring, at least one of the delay stages having a gain control input and receiving the frequency control input signal;
   an output stage coupled to one of the delay stages and providing an output signal with a frequency dependent upon the frequency control input signal; and
   a gain adjust circuit receiving the frequency control input signal and providing a gain control signal to the gain control inputs of the delay stages,
   wherein the gain control signal is provided at a level directly dependent upon the level of the frequency control input signal.

2. The ring oscillator of claim 1, wherein all of the delay stages have a gain control input and receive the frequency control input signal.

3. The ring oscillator of claim 1, wherein the plurality of delay stages are differential amplifiers.

4. The ring oscillator of claim 3, wherein the delay stages each comprise:
   a first leg with a first input transistor and a first delay control transistor, the first delay control transistor gated by the frequency control input signal;
   a second leg with a second input transistor and a second delay control transistor, the second delay control transistor gated by the frequency control input signal; and
   a gain adjust transistor gated by the gain control signal and sourcing an adjusted voltage to the first leg and the second leg.

5. The ring oscillator of claim 4, wherein when the frequency control input signal rises, the first delay control transistor and the second delay control transistor draw more current, reducing the amplitude of a first output signal and a second output signal,
   wherein when the frequency control input signal rises, the gain control signal from the gain adjust circuit falls, and
   wherein when the gain control signal from the gain adjust circuit falls, a voltage across the gain adjust transistor falls, increasing the amplitude of the first output signal and the second output signal.

6. The ring oscillator of claim 1, wherein the gain adjust circuit comprises:
   at least one pull up transistor coupled between a positive supply and the gain control signal;
   a variable pull down transistor coupled between the gain control signal and a negative supply, the variable pull down transistor gated by the frequency control input signal,
   wherein when the frequency control input signal rises, the variable pull down transistor passes more current, reducing the level of the gain control signal.

7. The ring oscillator of claim 1, wherein the output stage further comprises:
   a push-pull transistor pair driving the output signal responsive to an input from a delay stage; and
   at least one isolation transistor for decoupling the push-pull transistor pair from a positive supply and a negative supply responsive to an enable input being deasserted.

8. The ring oscillator of claim 7, wherein the output stage further comprises:
   a pull up transistor coupled between the positive supply and the output signal that pulls the output signal to a high level responsive to the enable signal being deasserted.

9. A method of operating a ring oscillator over a wide frequency range with a reduced current flow, the ring oscillator having a plurality of delay stages, an output stage, and a gain control stage, the method comprising the steps of:
   providing a frequency control voltage to at least some of the delay stages;
   providing a gain adjust input signal to at least some of the delay stages;
   adjusting the gain adjust signal solely responsive to the frequency control voltage signal such that the amplitude of the output of the delay stage increases to counteract a decrease in the output of the delay stage responsive to a change in the frequency control voltage; and
   providing an output clock signal from the output stage responsive to the outputs of one of the delay stages.

10. The method of claim 9, further comprising the step of:
    decoupling an amplifier of the output stage from supply voltages responsive to an enable signal being deasserted.

11. The method of claim 10, further comprising the step of:
    pulling up the output signal of the output stage responsive to the enable signal being deasserted.

12. A ring oscillator operating over a wide frequency range with a reduced current flow, the ring oscillator having a plurality of delay stages, an output stage, and a gain control stage, comprising:
    a means for providing a frequency control voltage to at least some of the delay stages;
    a means for providing a gain adjust input signal to at least some of the delay stages;
    a means for adjusting the gain adjust signal solely responsive to the frequency control voltage such that the amplitude of the output of the delay stage increases to counteract a decrease in the output of the delay stage responsive to each change in the frequency control voltage; and
    a means for providing an output clock signal from the output stage responsive to the outputs of one of the delay stages.

* * * * *